United States Patent
Xia et al.

(10) Patent No.: US 11,997,845 B2
(45) Date of Patent: May 28, 2024

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Jun Xia, Hefei (CN); Qiang Wan, Hefei (CN); Penghui Xu, Hefei (CN); Sen Li, Hefei (CN); Kangshu Zhan, Hefei (CN); Tao Liu, Hefei (CN)

(73) Assignee: Changxin Memory Technologies, Inc., Anhul (CN)

(*) Notice: Subject to any disclaimer, the term of this patent is extended or adjusted under 35 U.S.C. 154(b) by 376 days.

(21) Appl. No.: 17/503,479

(22) Filed: Oct. 18, 2021

(65) Prior Publication Data
US 2022/0246617 A1    Aug. 4, 2022

Related U.S. Application Data

(63) Continuation of application No. PCT/CN2021/108761, filed on Jul. 27, 2021.

(30) Foreign Application Priority Data

Jan. 29, 2021  (CN) .......................... 202110128710.2

(51) Int. Cl.
H10B 12/00    (2023.01)
(52) U.S. Cl.
CPC ............ *H10B 12/03* (2023.02); *H10B 12/09* (2023.02); *H10B 12/30* (2023.02); *H10B 12/50* (2023.02)

(58) Field of Classification Search
None
See application file for complete search history.

(56) References Cited

U.S. PATENT DOCUMENTS

| | | | |
|---|---|---|---|
| 6,716,756 B2 | 4/2004 | Kang | |
| 7,709,319 B2 | 5/2010 | Jon | |
| 8,846,485 B2 | 9/2014 | Kobayashi | |
| 2002/0127854 A1 | 9/2002 | Kang | |
| 2007/0045666 A1* | 3/2007 | Cho | H01L 28/91 |
| | | | 257/E23.15 |
| 2007/0063247 A1 | 3/2007 | Jon | |

(Continued)

FOREIGN PATENT DOCUMENTS

| | | | | |
|---|---|---|---|---|
| CN | 1869775 A | * | 11/2006 | ....... G02F 1/133555 |
| CN | 102339797 A | | 2/2012 | |
| CN | 113257835 A | * | 8/2021 | ......... H01L 27/1222 |

*Primary Examiner* — Michael Lebentritt
(74) *Attorney, Agent, or Firm* — Cooper Legal Group, LLC

(57) ABSTRACT

A method for manufacturing a semiconductor structure includes: a substrate is provided, in which the substrate is provided with a peripheral area and an array area; an insulation layer is formed on the substrate; a first mask layer with a first mask pattern is formed on the insulation layer; the insulation layer is etched by taking the first mask layer as a mask, to form a contact hole in the array area; a first electrode layer is formed; a second mask layer with a second mask pattern is formed, in which the second mask layer is arranged on the first electrode layer; and the first electrode layer and the first mask layer are etched by taking the second mask layer as a mask until the insulation layer in the array area is exposed, in which a remaining portion of the first electrode layer forms a lower electrode layer.

14 Claims, 12 Drawing Sheets

(56) References Cited

U.S. PATENT DOCUMENTS

| | | |
|---|---|---|
| 2008/0042240 A1 | 2/2008 | Jon |
| 2011/0117718 A1* | 5/2011 | Nakamura ........... H10B 12/318 |
| | | 438/387 |
| 2012/0015494 A1 | 1/2012 | Kobayashi |

* cited by examiner

METHOD FOR MANUFACTURING SEMICONDUCTOR STRUCTURE AND SEMICONDUCTOR STRUCTURE

CROSS-REFERENCE TO RELATED APPLICATION

This application is a continuation application of International Patent Application No. PCT/CN2021/108761, filed on Jul. 27, 2021, entitled "Method for Manufacturing Semiconductor Structure and Semiconductor Structure", which is based upon and claims priority to Chinese Patent Application No. 202110128710.2, filed on Jan. 29, 2021 and entitled "Method for Manufacturing Semiconductor Structure and Semiconductor Structure". The contents of International Patent Application No. PCT/CN2021/108761 and Chinese Patent Application No. 202110128710.2 are hereby incorporated by reference in their entireties.

TECHNICAL FIELD

Embodiments of this application relate to, but are not limited to a method for manufacturing a semiconductor structure and a semiconductor structure.

BACKGROUND

A memory in the semiconductor structure is a memory cell configured to store programs and various data information, and the memory may be divided into a read-only memory and a random access memory according to the using type of the memory. The memory usually includes a capacitor and a transistor connected to the capacitor, the capacitor is configured to store electric charge representing the storage information, and the transistor is a switch for controlling the electrical charge flowing and release of the capacitor.

With the continuously reduced process node of the memory, the distance between the adjacent capacitors is gradually shortened. In order to increase the electric capacity of the capacitor and improve the electrical performance of the semiconductor structure, higher requirements are put forward for the dimensional precision and the manufacturing process of the capacitor and the semiconductor structure.

SUMMARY

Embodiments of this application provide a method for manufacturing a semiconductor structure. The method includes the following operations. A substrate is provided, in which the substrate is provided with a peripheral area and an array area. An insulation layer is formed on the substrate, in which a thickness of the insulation layer in the peripheral area is less than a thickness of the insulation layer in the array area in a direction perpendicular to a surface of the substrate. A first mask layer with a first mask pattern is formed on the insulation layer. The insulation layer is etched by taking the first mask layer as a mask, to form a contact hole, which penetrates through the insulation layer, in the array area. A first electrode layer is formed, in which the first electrode layer at least covers a surface of the first mask layer and a surface of the contact hole in the array area. A second mask layer with a second mask pattern is formed, in which the second mask layer is arranged on the first electrode layer, and a pattern of the first mask pattern is complementary to a pattern of the second mask pattern. The first electrode layer and the first mask layer are etched by taking the second mask layer is used as a mask until the insulation layer in the array area is exposed, in which a remaining portion of the first electrode layer forms a lower electrode layer.

Embodiments of this application provide a semiconductor structure, including: a substrate provided with a peripheral area and an array area; an insulation layer at least arranged on the substrate in the peripheral area; and at least one lower electrode layer arranged in the array area, wherein a bottom and side walls of the lower electrode layer form a through hole, the bottom of the lower electrode layer abuts against the substrate, the side wall of the lower electrode layer away from the through hole abuts against the insulation layer, and a top surface of the lower electrode layer away from the substrate exceeds a top surface of the insulation layer away from the substrate.

BRIEF DESCRIPTION OF THE DRAWINGS

One or more embodiments are illustrated by figures in the drawings corresponding to the one or more embodiments. Unless otherwise stated, the figures in the drawings do not constitute a proportional restriction.

DETAILED DESCRIPTION

Figure 1:
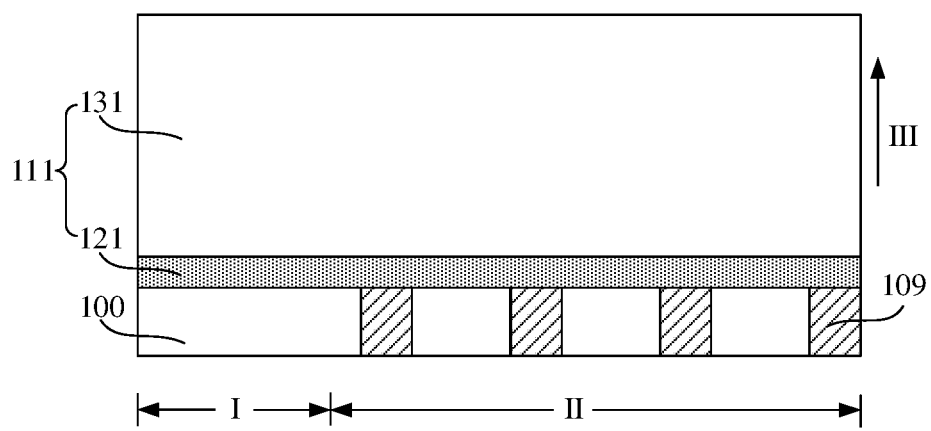
FIG. 1 to FIG. 12 are schematic cross-sectional diagrams of a semiconductor structure corresponding to operations in a method for manufacturing the semiconductor structure according to embodiments of this application.

It can be known from the background that the yield of the semiconductor structure in the related art needs to be improved and the electrical performance of the semiconductor structure needs to be improved.

It has been found through analysis that an etching process is easy to cause over etching on the insulation layer due to the etching load effect of the etching process when the insulation layer is patterned to form a capacitance hole, and the formed capacitance hole is not conducive to have higher dimensional precision. When the lower electrode layer is subsequently formed at the bottom and the side wall of the capacitance hole, the dimensional precision of the lower electrode layer will be further reduced, thereby reducing the electrical performance of the semiconductor structure.

In addition, in order to avoid the insulation layer from being over etched when the capacitance hole is formed, the mask layer is formed on the insulation layer, the mask layer and the insulation layer are patterned to form the capacitance hole, and then a conductive layer is formed on the remaining portion of the surface of the mask layer and the bottom and the side wall of the capacitance hole. Herein, the materials of the conductive layer and the mask layer are polycrystalline silicon. The mask layer and the conductive layer that exceed the top of the insulation layer are removed by adopting a chemical mechanical grinding process, so as to form the lower electrode layer. However, since the chemical mechanical grinding process generates greater squeezing action to the conductive layer during the chemical mechanical grinding process, the collapse of the conductive layer is easily caused, which affects the dimensional precision of the formed lower electrode layer and is not beneficial to the yield of the semiconductor structure. In addition, the top of the lower electrode layer formed by the chemical mechanical grinding process is flush with the top of the insulation layer, so that the height of the lower electrode layer is decided by the height of the insulation layer in a direction perpendicular to the surface of the substrate. In a case that the height of the lower electrode layer needs to be increased, to increase the electric capacity of the subsequently formed capacitor, the height of the insulation layer needs to be increased, which is not beneficial to reduce the preparation cost of the lower electrode layer.

In order to solve the abovementioned problem, embodiments of this application provide a method for manufacturing a semiconductor structure. The first mask layer is formed on the insulation layer. When the insulation layer is etched by taking the first mask layer as the mask to form the contact hole, the etching process performs over etching on the first mask layer, so that the insulation layer located below the first mask layer will not be damaged by the etching, and then the lower electrode layer subsequently formed at the side wall of the insulation layer has better dimensional precision. In addition, a portion of the first electrode layer and a portion of the first mask layer are etched by taking the second mask layer as the mask, to form the lower electrode layer. On the one hand, the lower electrode layer includes a first electrode layer located at the side wall of the first mask layer, which is beneficial to increase the height of the lower electrode layer in a direction perpendicular to the surface of the substrate under the precondition that the height of the insulation layer is not increased, so as to be beneficial to increase the electric capacity of the subsequently formed capacitor and improve the electrical performance of the semiconductor structure. On the other hand, the etching process has less squeezing action on the first electrode layer, which is beneficial to avoid the first electrode layer from collapsing due to the great stress, so that the formed lower electrode layer has better dimensional precision.

Various embodiments of this application are described in details below in combination with the drawings. However, those of ordinary skill in the art may understand that, in various embodiments of this application, various technical details are provided for readers to understand this application better. However, even without these technical details as well as various changes and modifications based on the embodiments below, the technical solution protected by this application may also be implemented.

FIG. 1-FIG. 12 are schematic cross-sectional diagrams of a semiconductor structure corresponding to operations in a method for manufacturing the semiconductor structure according to embodiments of this application.

Figure 2:
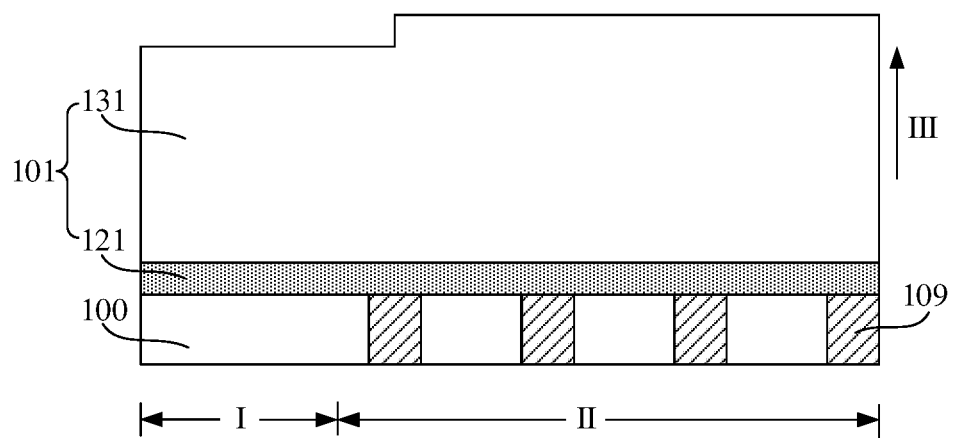

Referring to FIG. 2, a substrate 100 is provided. The substrate 100 is provided with a peripheral area I and an array area II. An insulation layer 101 is formed on the substrate 100. The thickness of the insulation layer 101 in the peripheral area I is less than the thickness of the insulation layer 101 in the array area II in a direction perpendicular to a surface of the substrate 100.

In this embodiment of this application, the semiconductor structure may be a memory, and a capacitance contact structure 109, a bit line, a word line and other structures are provided in the substrate 100. The peripheral area I is arranged around the array area II, the peripheral area I is configured to implement the electrical connection between the input and output circuit of the memory and other electrical elements, and the array area II is configured to implement the electrical connection between different conductive structures in the memory.

In this embodiment of this application, since the thickness of the insulation layer 101 in the peripheral area I is less than the thickness of the insulation layer 101 in the array area II in the direction III perpendicular to the surface of the substrate 100, the top surface of an initial first mask layer in the peripheral area I is lower than the top surface of the initial first mask layer in the array area II after the initial first mask layer is subsequently formed on the insulation layer 101. When the insulation layer 101 is subsequently etched by adopting a pattern-dry etching process to form the contact hole, etching gas is firstly in contact with the initial first mask layer in the array area II, and then is in contact with the initial first mask layer in the peripheral area I. This is beneficial to reduce the etching amount of the initial first mask layer in the peripheral area I in the etching process, so that the remaining portion of the initial first mask layer in the peripheral area I has a suitable thickness after the etching process ends up. Such suitable thickness enables to protect the insulation layer 101 located below the remaining portion of the initial first mask layer in the peripheral area I when a portion of the insulation layer 101 in the array area II is subsequently etched by taking the remaining portion of the initial first mask layer in the peripheral area I as a mask, thereby avoiding the insulation layer 101 in the peripheral area I from being etched.

In some embodiments, referring to FIG. 1 and FIG. 2, forming the insulation layer 101 includes the following operations. A base insulation layer 111 is formed on the substrate 100, in which the thickness of the base insulation layer 111 in the peripheral area I is equal to the thickness of the base insulation layer 111 in the array area II in a direction perpendicular to the surface of the substrate 100. The base insulation layer 111 is patterned to form the insulation layer 101.

In the embodiments of this application, forming the base insulation layer 111 includes the following operations. A dielectric layer 121 is formed on the substrate 100, and a supporting layer 131 is formed on the dielectric layer 121. In an example, the material of the dielectric layer 121 may be silicon nitride, and the material of the supporting layer may be silicon oxide.

Figure 4:
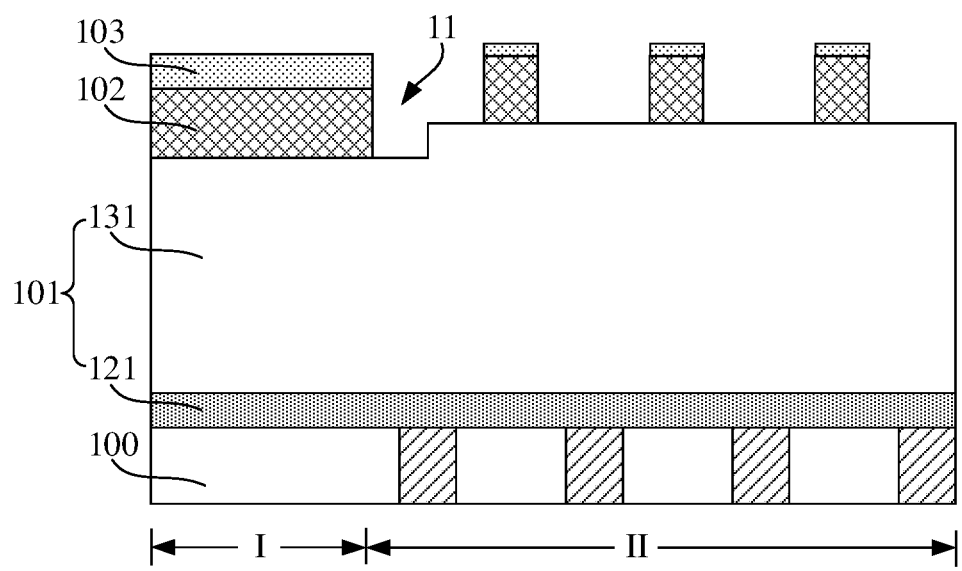

Referring to FIG. 4, the first mask layer 102 with the first mask pattern is formed on the insulation layer 101, and a plurality of first through holes 11 are formed in the first mask layer 102 in the array area. Subsequently, the insulation layer 101 exposed from the first through holes 11 is etched, to form the contact hole penetrating through the insulation layer 101.

Since the top surface of the insulation layer 101 in the peripheral area I is lower than the top surface of the insulation layer 101 in the array area II in the direction III perpendicular to the surface of the substrate 100, the top surface of the first mask layer 102 in the peripheral area I is also lower than the top surface of the first mask layer 102 in the array area II. When the insulation layer 101 is subsequently patterned to form the contact hole, the insulation layer 101 is etched by taking the first mask layer 102 as the mask, so that the etching process damages the first mask layer 102, and the damage to the insulation layer 101 located below the first mask layer 102 caused by the etching process is avoided. Therefore, the lower electrode layer subsequently formed at the side wall of a portion of the insulation layer 101 has better dimensional precision.

Figure 3:
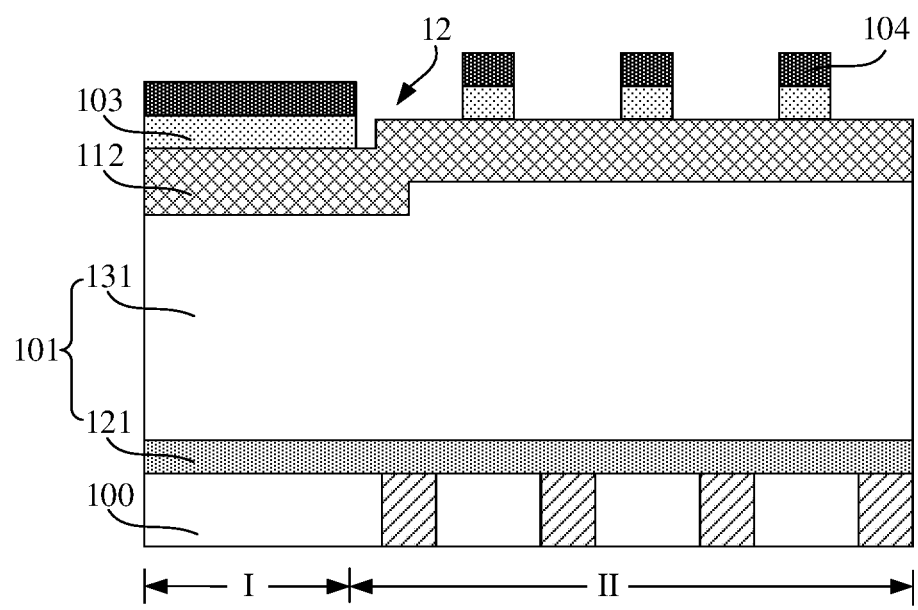

In some embodiments, forming the first mask layer 102 with the first mask pattern includes the following operations. Referring to FIG. 3, an initial first mask layer 112 is formed on the insulation layer 101, and a first photoresist layer 103 with the first mask pattern is formed on the initial first mask layer 112. Referring to FIG. 4, the initial first mask layer 112 is etched by taking the first photoresist layer 103 as a mask, to form the first mask layer 102.

In the embodiments of this application, forming the first photoresist layer 103 includes the following operations. An initial first photoresist layer is formed on the initial first mask layer 112, a first photomask 104 is adopted to perform exposure treatment on the initial first photoresist layer, and then the initial first photoresist layer is subjected to development treatment, to form the first photoresist layer 103 with the first mask pattern. Still referring to FIG. 3, a plurality of second through holes 12 are formed in the first photoresist layer 103 in the array area II.

Referring to FIG. 3 and FIG. 4, the initial first mask layer 112 is etched by taking the first photoresist layer 103 as the mask through a first etching process (referring to FIG. 3), and in this operation, the first photoresist layer 103 will be damaged due to the etching. Since the plurality of second through holes 12 are formed in the first photoresist layer 103 in the array area II, the pattern density of the pattern on the first photoresist layer 103 in the peripheral area I is much less than the pattern density of the pattern on the first photoresist layer 103 in the array area II. That is, there is difference between the pattern density of the pattern on the first photoresist layer 103 in the peripheral area I and the pattern density of the pattern on the first photoresist layer 103 in the array area II, thus the first etching process has a greater etching rate on the first photoresist layer 103 in the array area II, and has a smaller etching rate on the first photoresist layer 103 in the peripheral area I. After the first through holes 11 are formed, the etched amount of the first photoresist layer 103 in the array area II is greater than the etched amount of the first photoresist layer 103 in the peripheral area I, so that the thickness of the first photoresist layer 103 in the peripheral area I is greater than the thickness of the first photoresist layer 103 in the array area II.

In other embodiments, when the first initial mask layer is thicker in the direction perpendicular to the surface of the substrate, the formed first through holes are deeper, and the first etching process has longer process duration. The first photoresist layer in the array area is completely etched, and the remaining portion of the first photoresist layer only exists in the first mask layer in the peripheral area.

Figure 5:
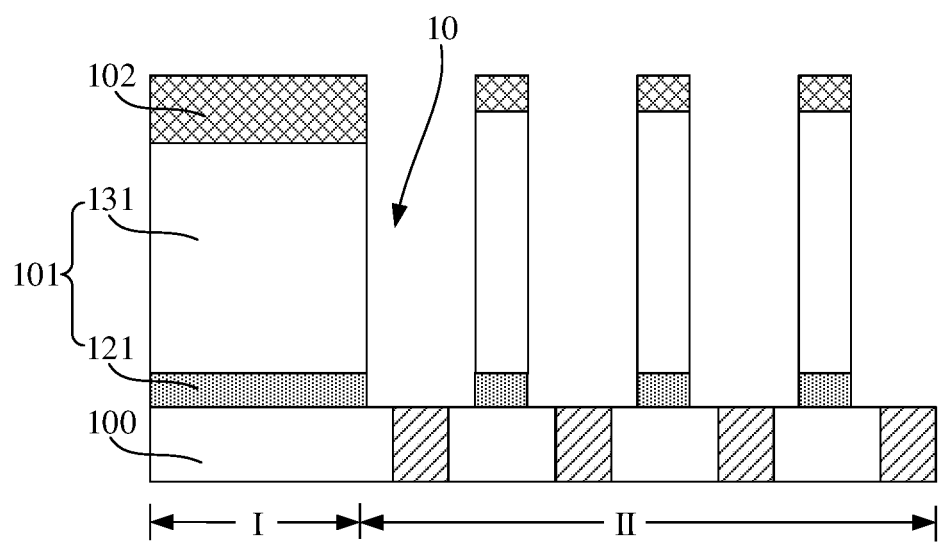

In the embodiments of this application, referring to FIG. 4 and FIG. 5, the first photoresist layer 103 on the first mask layer 102 is reserved, and the insulation layer 101 is etched by taking the first photoresist layer 103 and the first mask layer 102 as a mask, so that the contact hole 10 penetrating through the insulation layer 101 is formed in the array area II.

The initial insulation layer 101 is etched by taking the first photoresist layer 103 and the first mask layer as the mask through a second etching process, and in this operation, the first photoresist layer 103 and the first mask layer 102 will be damaged due to the etching. Since the pattern density on the first mask pattern in the peripheral area I is much less than the pattern density on the first mask pattern in the array area II, the second etching process has greater etching rate on the first photoresist layer 103 and the first mask layer 102 in the array area II, and has smaller etching rate on the first photoresist layer 103 and the first mask layer 102 in the peripheral area I. The lower electrode layer is subsequently formed at the bottom and side wall of the contact hole 10, and the greater depth of the contact hole 10 is required. After the contact hole 10 is formed, the etched amount of the first photoresist layer 103 and the etched amount of the first mask layer 102 are great, and the etched amount of the first photoresist layer 103 and the first mask layer 102 in the array area II is greater than the etched amount of the first photoresist layer 103 and the first mask layer 102 in the peripheral area I.

In the embodiments of this application, the remaining portion of the first photoresist layer 103 and the first mask layer 102 are used as the mask, which is beneficial to improve the total thickness of the mask, so that the second etching process damages the remaining portion of the first photoresist layer 103 and the first mask layer 102, and the damage to the insulation layer 101 below the first mask layer 102 caused by the second etching process is avoided. This is beneficial to control the dimensional precision of the insulation layer 101 located below the first mask layer 102, so that the lower electrode layer subsequently formed has higher dimensional precision.

In the embodiments of this application, after the contact hole 10 is formed, the first photoresist layer 103 is completely etched away through the second etching process, and a portion of the first mask layer 102 in the array area II is etched, so that the top of the first mask layer 102 in the peripheral area I is flush with the top of the first mask layer 102 in the array area II, which is beneficial to form the first electrode layer uniformly covered on the surface of the first mask layer and the surface of the contact hole 10. In other embodiments, after the contact hole is formed, the remaining portion of the first photoresist layer is on the first mask layer in the peripheral area, and a portion of the first photoresist layer is removed before the first electrode layer is subsequently formed.

In the embodiment of this application, after the contact hole 10 is formed, and before the first electrode layer and the first mask layer 102 are subsequently etched by taking the second mask layer as the mask, the thickness of the first mask layer 102 in the peripheral area I is greater than the thickness of the first mask layer 102 in the array area II in the direction perpendicular to the surface of the substrate 100. In an example, the thickness difference between the first mask layer 102 in the peripheral area I and the first mask layer 102 in the array area II ranges from 10 nm to 20 nm. In the operation that the first electrode layer and the first mask layer 102 are subsequently etched by taking the second mask layer as the mask to form the lower electrode layer, the thickness of the first mask layer 102 in the peripheral area I is greater than the thickness of the first mask layer 102 in the array area II, so that the first mask layer 102 with a suitable thickness is on the insulation layer 101 in the peripheral area II after the lower electrode layer is formed. The first mask layer 102 is used as the mask for subsequently etching the insulation layer 101 in the array area, so that the insulation layer 101 in the peripheral area I will not be damaged when the insulation layer 101 in the array area II is etched.

In other embodiments, after the initial first mask layer is etched by taking the first photoresist layer as the mask to form the first mask layer, the first photoresist layer on the first mask layer is removed, and the insulation layer is subsequently etched by only taking the first mask layer as the mask, so that the contact hole penetrating through the insulation layer is formed in the array area.

Figure 6:
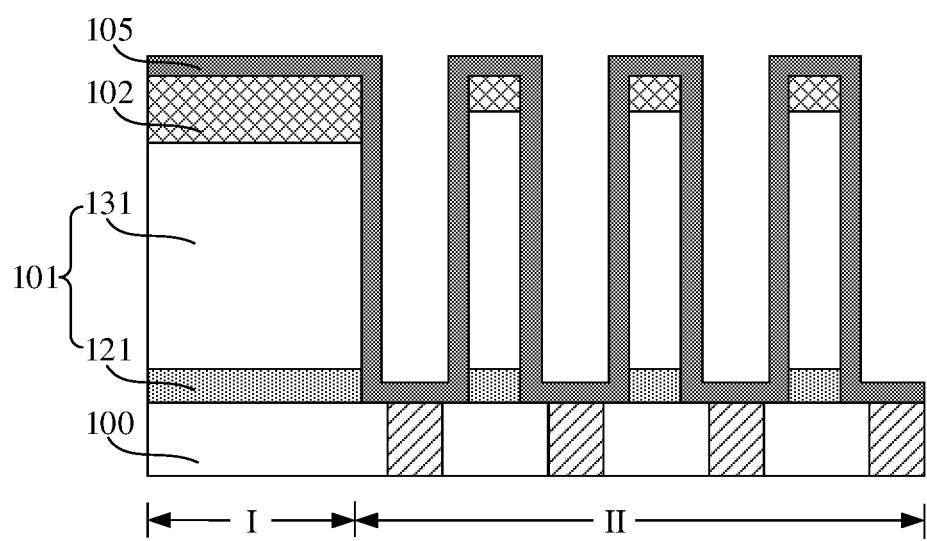

Referring to FIG. 6, the first electrode layer 105 is formed. The first electrode layer 105 at least covers a surface of the first mask layer 102 and a surface of the contact hole (referring to FIG. 5) in the array area II. When the first mask layer 102 is subsequently removed, the first electrode layer 105 located on the top surface of the first mask layer 102 will also be removed, and the remaining portion of the first electrode layer 105 forms the lower electrode layer. Under the precondition that the insulation layer 101 is not damaged, the first electrode layer 105 at the side wall of the first mask layer 102 in the array area II also forms the lower electrode layer, which is beneficial to increase the height of the lower electrode layer in the direction perpendicular to the surface of the substrate 100.

In the embodiments of this application, the first electrode layer 105 further covers a surface of the first mask layer 102 in the peripheral area I. The operation that the first electrode layer 105 is subsequently etched by taking the second mask layer as the mask further includes the following operation. The first electrode layer 105 on the first mask layer 102 in the peripheral area I is removed. In other embodiments, the first electrode layer may be only arranged on the surface of the first mask layer and the surface of the contact hole in the array area.

In the embodiments of this application, the first electrode layer 105 may be formed by a deposition process, which includes a chemical vapor deposition or an atomic layer deposition. The material of the first electrode layer 105 is the same as the material of the first mask layer 102. In an example, the material of the first electrode layer 105 and the material of the first mask layer 102 are polycrystalline silicon, which is beneficial to simplify the process operation that the semiconductor structure is prepared by synchronously removing a portion of the first mask layer 102 and a portion of the first electrode layer 105 in a case that the subsequently formed lower electrode layer has better dimensional precision. In other embodiments, the material of the first electrode layer may be different from the material of the first mask layer. For example, the material of the first electrode layer may be titanium nitride, titanium, tungsten and other conductive materials, and the material of the first mask layer may be other materials which have a higher etching ratio relative to the insulation layers.

Figure 9:
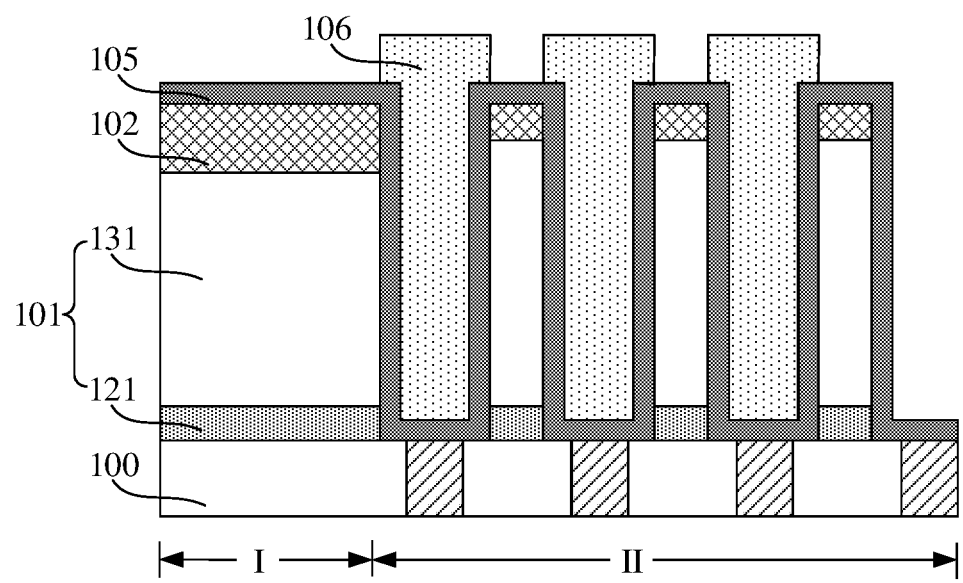

Referring to FIG. 9, a second mask layer 106 with a second mask pattern is formed, the second mask layer 106 is arranged on the first electrode layer 105, and the pattern of the first mask pattern is complementary to the pattern of the second mask pattern.

In the embodiment of this application, the material of the second mask layer 106 is photoresist, which is beneficial to form the second mask layer 106 with the second mask pattern by performing subsequent exposure and development treatment on an initial second mask layer. In other embodiments, the material of the second mask layer may be dielectric substance including Si-H bonds, Si-N bonds and N-H bonds.

Figure 7:
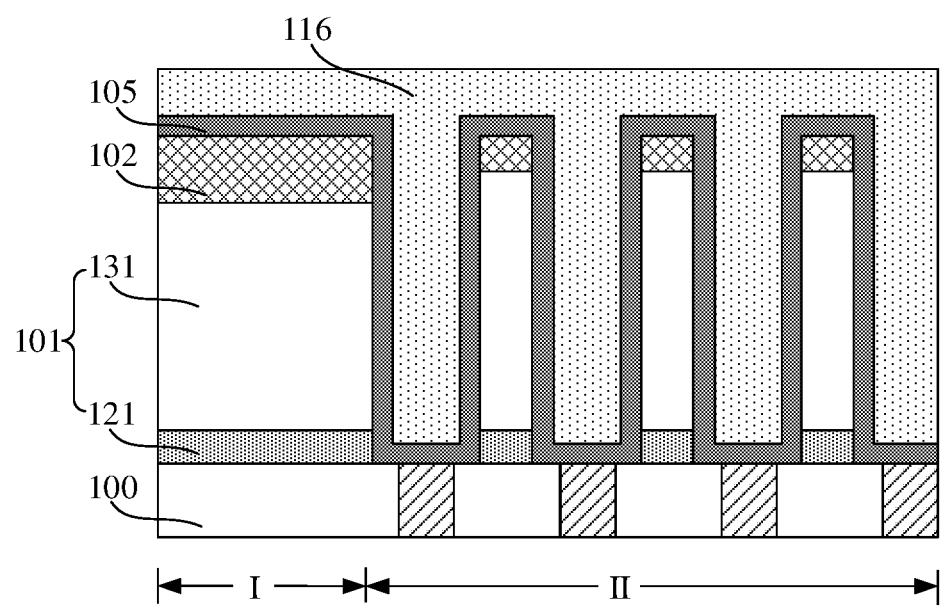
Figure 8:
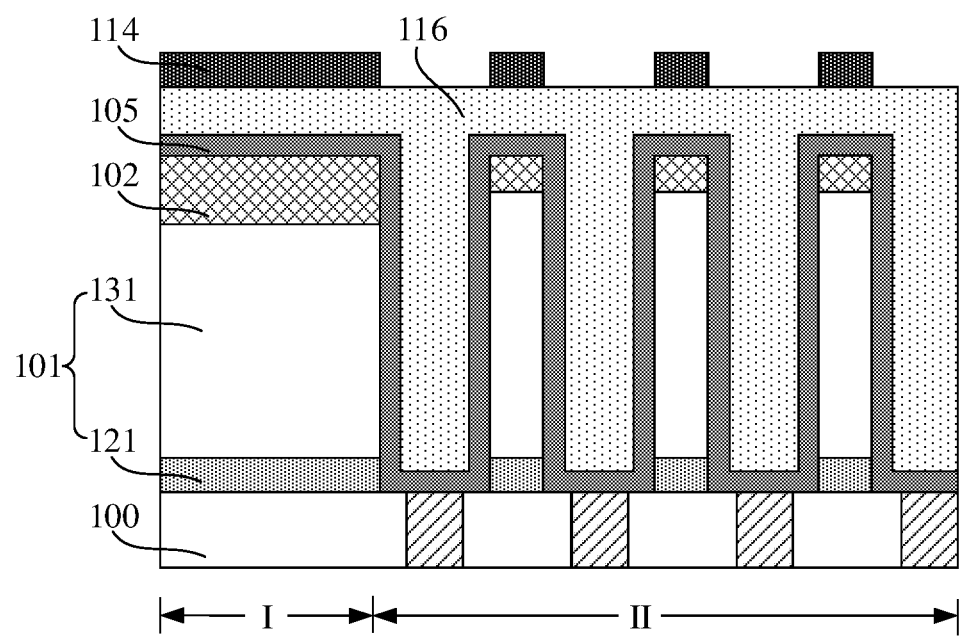

In other embodiments, forming the second mask layer 106 with the second mask pattern includes the following operations. Referring to FIG. 7, an initial second mask layer 116 is formed, in which the initial second mask layer 116 covers a surface of the first electrode layer 105, and a top surface of the initial second mask layer 116 exceeds a top surface of the first electrode layer 105. Referring to FIG. 8 and FIG. 9, the initial second mask layer 116 is patterned to form the second mask layer 106.

Still referring to FIG. 8, patterning the initial second mask layer 116 includes the following operations. A second photoresist layer (not shown in the figure) is formed on the initial second mask layer 116, a second photomask 114 is adopted to perform the exposure treatment on the second photoresist layer, and then the second photoresist layer is subjected to development treatment to form the second mask layer with the second mask pattern.

In the embodiment of this application, since the pattern of the first mask pattern is complementary to the pattern of the second mask pattern, the photomask adopted to form the first mask pattern is the same as the photomask adopted to form the second mask pattern. That is, the first photomask 104 is the same as the second photomask 114, which is beneficial to reduce the preparation cost of the semiconductor structure. In addition, since the photomask adopted to form the first mask pattern is the same as the photomask adopted to form the second mask pattern, the photomask has the same alignment standards with the photoresist layers needing the exposure treatment when the first mask pattern and the second mask pattern are formed, which is beneficial to simplify the preparation process operations of the semiconductor structure.

In some embodiments, the property of the photoresist for forming the second mask layer 106 is different from the property of the photoresist for forming the first photoresist layer 103. In an example, the material of the first photoresist layer 103 is positive photoresist, and the material of the photoresist layer of the second mask layer 106 is negative photoresist. In other embodiments, the property of the photoresist for forming the second mask layer may be the same as the property of the photoresist for forming the first photoresist layer, thus the first photomask adopted to form the first mask pattern is different from the second photomask adopted to form the second mask pattern, for example, the pattern of the first photomask is complementary to the pattern of the second photomask.

Figure 10:
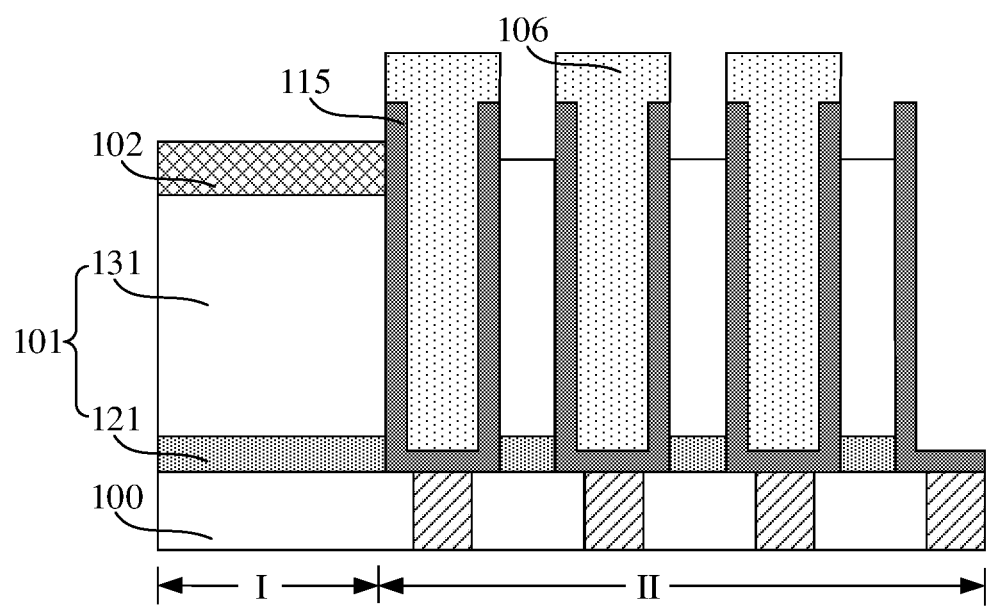

Referring to FIG. 9 and FIG. 10, the first electrode layer 105 and the first mask layer 102 are etched by taking the second mask layer 106 as a mask until the insulation layer 101 in the array area II is exposed, in which the remaining portion of the first electrode layer 105 forms a lower electrode layer 115.

In the embodiment of this application, the second mask layer 106 covers the first electrode layer 105 located at the side wall of the first mask layer 102. When the etching is performed by taking the second mask layer 106 as the mask through a third etching process, the first electrode layer 105 located at the side wall of the first mask layer 102 is not etched, and the height of the formed lower electrode layer 115 is higher than the height of the insulation layer 101 in the array area II in the direction perpendicular to the surface of the substrate 100, which is beneficial to increase the height of the formed lower electrode layer 115 and improve the electrical performance of the semiconductor structure. In addition, the squeezing action generated by the third etching process on the first electrode layer is small during the etching, which is beneficial to avoid the first electrode layer 105 from collapsing due to the great stress, so that the formed lower electrode layer 115 has better dimensional precision.

In some embodiments, since the pattern density on the first mask layer 102 in the peripheral area I is much less than the pattern density on the first mask layer 102 in the array area II, the third etching process has a greater etching rate on the first mask layer 102 located in the array area II and has a smaller etching rate on the first mask layer 102 in the peripheral area I. Before the third etching process is adopted, the thickness of the first mask layer 102 in the peripheral area I is greater than the thickness of the first mask layer 102 in the array area II. When the first mask layer 102 in the array area II is completely removed by the third etching process, the first mask layer 102 with the suitable thickness is also on the insulation layer 101 in the peripheral area I. Such suitable thickness can avoid the insulation layer 101 in the peripheral area I from being etched when a portion of the insulation layer 101 in the array area II is subsequently etched by taking the first mask layer 102 in the peripheral area I as a mask.

Figure 11:
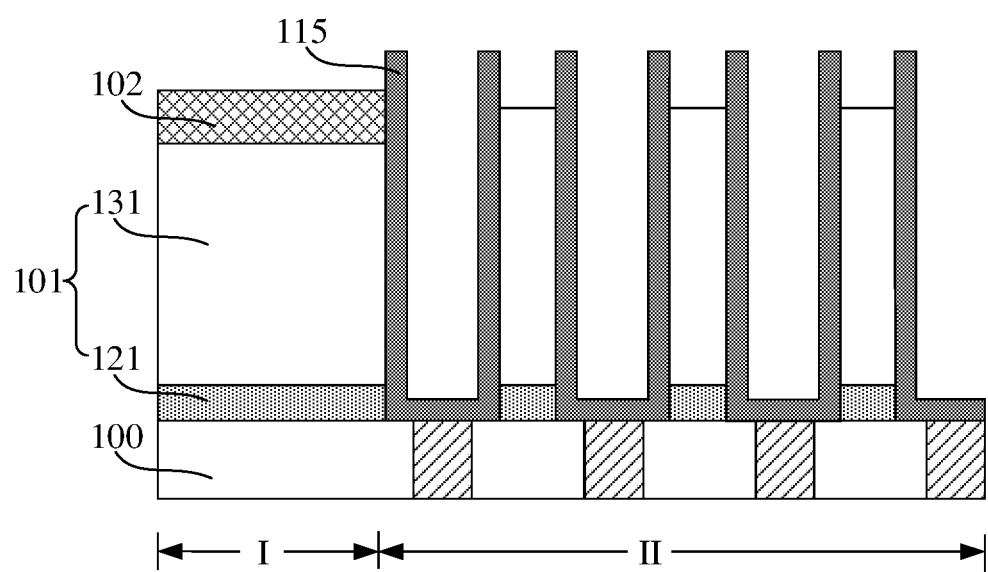
Figure 12:
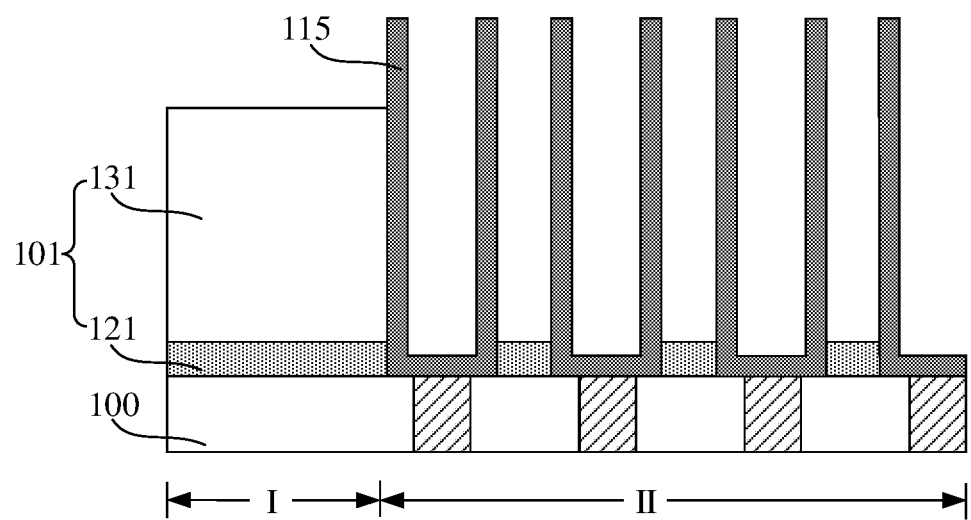

Still referring to FIG. 10, after the first electrode layer 105 (referring to FIG. 9) and the first mask layer 102 are etched by taking the second mask layer 106 as a mask, the remaining portion of the first mask layer 102 is only located on the insulation layer 101 in the peripheral area I. Referring to FIG. 11, the second mask layer 106 is removed. Referring to FIG. 11 and FIG. 12, a portion of the insulation layer 101 in the array area II is removed by taking the remaining portion of the first mask layer 102 and the lower electrode layer 115 as the mask, and the remaining portion of the first mask layer 102 is removed.

In the embodiments of this application, a portion of the insulation layer 101 in the array area II is removed by adopting a wet etching process. The insulation layer 101 includes the dielectric layer 121 and the supporting layer 131 that are successively stacked onto one another, and the dielectric layer 121 has a high etching selection ratio to the first mask layer 102 and the lower electrode layer 115. When a portion of the insulation layer 101 in the array area II is removed, the first mask layer 102 and the lower electrode layer 115 may protect the insulation layer 101 and the substrate 100 in the peripheral area I, to avoid the insulation layer 101 and the substrate 100 in the peripheral area I from being etched. In addition, the dielectric layer 121 has a high etching selection ratio to the supporting layer 131. Therefore, when a portion of the insulation layer 101 in the array area II is removed, the supporting layer 131 in the array area II is removed by taking the dielectric layer 121 as an etching stopping layer, which is beneficial to avoid the substrate 100 below the supporting layer 131 from being etched.

In the embodiments of this application, the first mask layer 102 with the first mask pattern and the second mask layer 106 with the second mask pattern are formed through the same photomask, which is beneficial to reduce the preparation cost of the semiconductor structure. When the etching is subsequently performed by taking the second mask layer 106 as the mask, one the one hand, the second mask layer 106 covers the first electrode layer 105 at the side wall of the first mask layer 102, the lower electrode layer 115 includes the first electrode layer 105 located at the side wall of the first mask layer 102, which is beneficial to increase the height of the lower electrode layer 115 in the direction perpendicular to the surface of the substrate 100 under the precondition that the height of the insulation layer 101 is not increased, and to increase the electric capacity of the subsequently formed capacitor and improve the electrical performance of the semiconductor structure. On the other hand, the etching process has less squeezing action on the first electrode layer 105, which is beneficial to avoid the first electrode layer 105 from collapsing due to the great stress, so that the formed lower electrode layer 115 has better dimensional precision.

Embodiments of this application further provide a semiconductor structure, which may be formed through the above method provided by the abovementioned embodiments. Referring to FIG. 10 or FIG. 12, the semiconductor structure includes: a substrate 100 provided with a peripheral area I and an array area II; an insulation layer 101 at least arranged on the substrate 100 in the peripheral area I; and a lower electrode layer 115 arranged in the array area II. A bottom and side walls of the lower electrode layer 115 form a through hole, the bottom of the lower electrode layer 115 abuts against the substrate 100, the side wall of the lower electrode layer 115 away from the through hole abuts against the insulation layer 101. A top surface of the lower electrode layer 115 away from the substrate 100 exceeds a top surface of the insulation layer 101 away from the substrate 100, which is beneficial to increase the height of the lower electrode layer 115 under the precondition that the height of the insulation layer 101 is not increased.

In an example, referring to FIG. 10, the insulation layer 101 is also arranged on the substrate 100 in the array area II, and the insulation layer 101 in the array area II is arranged between adjacent lower electrode layers 115. The thickness of the insulation layer 101 in the peripheral area I is less than the thickness of the insulation layer 101 in the array area I in the direction perpendicular to the surface of the substrate 100. The peripheral area I is provided with the first mask layer 102. The second mask layer 106 is arranged on a surface of the lower electrode layer 115. After the second mask layer 106 is subsequently removed, the insulation layer 101 in the array area II is etched by taking the first mask layer 102 in the peripheral area I as the mask, which is convenient to subsequently form the upper electrode layer, so as to form a capacitor. In addition, the thickness of the insulation layer 101 in the peripheral area I is less than the thickness of the insulation layer 101 in the array area I, which is beneficial to increase the exposed surface area of the lower electrode layer 115. When the isolation layer and the upper electrode layer are successively formed on the surface of the lower electrode layer 115, the alignment area between the upper electrode layer and the lower electrode layer 115 is increased, and the electric capacity of the formed capacitor is increased.

In another example, referring to FIG. 12, only the peripheral area I is provided with the insulation layer 101, and the second mask layer 106 has been removed, which is convenient to successively form the insulation layer and the upper electrode layer on the surface of the lower electrode layer.

In the embodiments of this application, a height difference between the top surface of the lower electrode layer 115 away from the substrate 100 and the top surface of the insulation layer 101 away from the substrate 100 ranges from 10 nm to 20 nm, which is beneficial to increase the height of the lower electrode layer 115 and increase the electric capacity of the capacitor subsequently formed under the precondition that the height of the insulation layer 101 is not increased, thereby improving the electric performance of the semiconductor structure.

In addition, since the side walls of the adjacent lower electrode layers 115 are parallel to each other, the distance between the side walls of the adjacent lower electrode layers 115 is constant, which is beneficial to reduce the probability of the short circuit between the adjacent lower electrode layers 115. When a gap is formed between the side walls of the adjacent lower electrode layers 115 after a portion of the insulation layer 101 in the array area II is subsequently removed, the top opening size of the gap is consistent with the bottom opening size of the gap, which is beneficial to subsequently fill materials in the gap.

Those of ordinary skill in the art may understand that the abovementioned implementation modes are some embodiments for realizing this application. However, in actual application, various changes may be made to the forms and details without deviating from the spirit and scope of this application. Those skilled in any art may make respective change and modification without deviating from the spirit and scope of this application, therefore, the protection scope of this application shall be subjected the scope defined in claims.

The invention claimed is:

1. A method for manufacturing a semiconductor structure, comprising:
providing a substrate, wherein the substrate is provided with a peripheral area and an array area;

forming an insulation layer on the substrate, wherein a thickness of the insulation layer in the peripheral area is less than a thickness of the insulation layer in the array area in a direction perpendicular to a surface of the substrate;

forming a first mask layer with a first mask pattern on the insulation layer;

etching the insulation layer by taking the first mask layer as a mask, to form a contact hole, which penetrates through the insulation layer, in the array area;

forming a first electrode layer, wherein the first electrode layer at least covers a surface of the first mask layer and a surface of the contact hole in the array area;

forming a second mask layer with a second mask pattern, wherein the second mask layer is arranged on the first electrode layer, and a pattern of the first mask pattern is complementary to a pattern of the second mask pattern; and etching the first electrode layer and the first mask layer by taking the second mask layer as a mask until the insulation layer in the array area is exposed, wherein a remaining portion of the first electrode layer forms a lower electrode layer.

2. The method for manufacturing the semiconductor structure of claim 1, wherein photomask for forming the first mask pattern is the same as photomask for forming the second mask pattern.

3. The method for manufacturing the semiconductor structure of claim 1, wherein after the contact hole is formed and before the first electrode layer and the first mask layer are etched by taking the second mask layer as the mask, a thickness of the first mask layer in the peripheral area is greater than a thickness of the first mask layer in the array area in the direction perpendicular to the surface of the substrate.

4. The method for manufacturing the semiconductor structure of claim 3, wherein forming the first mask layer with the first mask pattern comprises:

forming an initial first mask layer on the insulation layer;

forming a first photoresist layer with the first mask pattern on the initial first mask layer; and etching the initial first mask layer by taking the first photoresist layer as a mask, to form the first mask layer.

5. The method for manufacturing the semiconductor structure of claim 4, wherein etching the insulation layer by taking the first mask layer as the mask comprises: etching the insulation layer by taking the first photoresist layer and the first mask layer as a mask, wherein the first photoresist layer on the first mask layer is reserved; and removing the first photoresist layer before forming the first electrode layer.

6. The method for manufacturing the semiconductor structure of claim 5, wherein the first electrode layer covers a surface of the first mask layer in the peripheral area, and wherein etching the first electrode layer by taking the second mask layer as the mask further comprises:

removing the first electrode layer on the first mask layer in the peripheral area.

7. The method for manufacturing the semiconductor structure of claim 6, wherein forming the second mask layer with the second mask pattern comprises:

forming an initial second mask layer, wherein the initial second mask layer covers a surface of the first electrode layer, and a top surface of the initial second mask layer exceeds a top surface of the first electrode layer; and patterning the initial second mask layer to form the second mask layer.

8. The method for manufacturing the semiconductor structure of claim 7, wherein a material of the second mask layer comprises photoresist or dielectric substance comprising Si-H bonds, Si-N bonds and N-H bonds.

9. The method for manufacturing the semiconductor structure of claim 8, wherein a property of the photoresist for forming the second mask layer is different from a property of photoresist for forming the first photoresist layer.

10. The method for manufacturing the semiconductor structure of claim 1, wherein forming the insulation layer comprises: forming a base insulation layer on the substrate, wherein a thickness of the base insulation layer in the peripheral area is equal to a thickness of the base insulation layer in the array area in the direction perpendicular to the surface of the substrate; and patterning the base insulation layer to form the insulation layer.

11. The method for manufacturing the semiconductor structure of claim 1, wherein after the first electrode layer and the first mask layer are etched by taking the second mask layer as the mask, a remaining portion of the first mask layer is located on the insulation layer in the peripheral area, and the method further comprises:

removing the second mask layer;

removing a portion of the insulation layer in the array area by taking the remaining portion of the first mask layer and the lower electrode layer as a mask; and removing the remaining portion of the first mask layer.

12. The method for manufacturing the semiconductor structure of claim 1, wherein a material of the first mask layer is the same as a material of the first electrode layer.

13. A semiconductor structure, comprising:

a substrate provided with a peripheral area and an array area;

an insulation layer at least arranged on the substrate in the peripheral area; and a plurality of lower electrode layers arranged in the array area, the insulation layer arranged on the substrate in the array area and arranged between adjacent lower electrode layers of the lower electrode layers, wherein a bottom and side walls of each of the lower electrode layers form a through hole, the bottom of each of the lower electrode layers abuts against the substrate, the side wall of each of the lower electrode layers away from the through hole abuts against the insulation layer, and a top surface of each of the lower electrode layers away from the substrate exceeds a top surface of the insulation layer away from the substrate; and a thickness of the insulation layer in the peripheral area is less than a thickness of the insulation layer in the array area in a direction perpendicular to a surface of the substrate.

14. The semiconductor structure of claim 13, wherein a height difference between the top surface of each of the lower electrode layers away from the substrate and the top surface of the insulation layer away from the substrate ranges from 10 nm to 20 nm.

* * * * *